(12) United States Patent
Kubota et al.

(10) Patent No.: US 6,525,261 B1
(45) Date of Patent: *Feb. 25, 2003

(54) RESIN COMPOSITION AND AN ELECTRONIC DEVICE USING THE SAME

(75) Inventors: Yuichi Kubota, Chiba (JP); Yukihiro Isobe, Yamanashi (JP); Akemi Takenouchi, St. Anthony, MN (US); Makoto Hosokawa, Kanagawa (JP)

(73) Assignees: Semiconductor Energy Laboratory Co., Ltd. (JP); TDK Corporation (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/525,122

(22) Filed: Mar. 14, 2000

Related U.S. Application Data

(60) Division of application No. 08/868,833, filed on Jun. 9, 1997, now abandoned, which is a continuation-in-part of application No. 08/529,782, filed on Sep. 18, 1995, now Pat. No. 5,637,156.

(30) Foreign Application Priority Data

Sep. 22, 1994 (JP) .............................................. 6-254229
Sep. 22, 1994 (JP) .............................................. 6-254230

(51) Int. Cl.$^7$ ..................... H01L 31/048; H01L 31/042; H02N 6/00; C08G 18/80
(52) U.S. Cl. ...................... 136/243; 136/251; 136/252; 257/431; 257/433; 257/788; 528/45
(58) Field of Search ................................. 523/435, 443, 523/457, 458, 459, 466, 468; 524/413, 424, 425, 430, 431, 437, 783, 786, 788; 525/109, 11, 101, 119, 124, 131, 123, 132, 330.3, 330.5, 329.7, 329.9, 454, 455, 476, 479, 528, 529, 534; 528/45, 73, 76, 79; 136/243, 252, 251; 257/431, 433, 788

(56) References Cited

U.S. PATENT DOCUMENTS

| | | | |
|---|---|---|---|
| 4,476,261 A | 10/1984 | Patzschke et al. | 523/402 |
| 4,522,851 A | 6/1985 | Rosthauser | 427/386 |
| 4,608,304 A | 8/1986 | Rosthauser | 428/378 |
| 4,766,183 A | 8/1988 | Rizk et al. | 525/454 |
| 4,829,105 A | 5/1989 | Yamada et al. | 523/415 |
| 4,842,938 A | 6/1989 | Rizk et al. | 428/416 |
| 4,953,577 A | 9/1990 | Marshall | 136/251 |
| 5,074,979 A | 12/1991 | Valko et al. | 523/415 |
| 5,114,552 A | 5/1992 | McCollum et al. | 524/901 |
| 5,234,983 A | 8/1993 | Valenty | 524/283 |
| 5,340,946 A | 8/1994 | Friedrich et al. | 174/256 |
| 5,354,385 A | 10/1994 | Hashimoto et al. | 136/259 |
| 5,576,867 A | 11/1996 | Baur et al. | 359/87 |
| 5,598,285 A | 1/1997 | Kondo et al. | 349/39 |
| 5,756,221 A | 5/1998 | Horibe et al. | 428/626 |

FOREIGN PATENT DOCUMENTS

| | | |
|---|---|---|
| JP | 59-69874 | 6/1981 |
| JP | 60-210882 | 10/1985 |
| JP | 61-218625 | 9/1986 |
| JP | 63-17342 | 4/1988 |

OTHER PUBLICATIONS

Oertel; *Polyurethane Handbook: Chemistry– Raw Materials–Processing–Applications–Properties*; Hanser Publishers; New York; 1985; pp. 388,389,442,443, 496–498, and 523–525.*

\* cited by examiner

*Primary Examiner*—Rabon Sergent
(74) *Attorney, Agent, or Firm*—Nixon Peabody LLP; Jeffrey L. Costellia

(57) ABSTRACT

An electronic device, such as a solar cell, having improved moisture, heat, and wear resistance, formed by applying an insulating film over the surfaces of the electronic device utilizing a screen printing process and curing the film with heat. The insulating film is composed of a mixture of two resin components, the first component comprising a polyfunctional blocked isocyanate compound where a dicarbonyl compound is used as a block agent, which dissociates and isocyanate group upon heating, and, a second component comprising a polyol comprising polymers or oligomers having reactive hydroxyl groups which react with isocyante groups to form urethane bonds

27 Claims, 3 Drawing Sheets

RESIN COMPOSITION AND AN ELECTRONIC DEVICE USING THE SAME

This application is a Divisional of application Ser. No. 08/868,833, filed Jun. 9, 1997, abandoned, which is itself a Continuation-in-Part of application Ser. No. 08/529,782, filed Sep. 18, 1995, now U.S. Pat. No. 5,637,156.

BACKGROUND OF THE INVENTION

1. Field of the Invention

The present invention relates to an insulating resin composition and/or a transparent insulating resin composition, and more particularly, it relates to a resin composition suitable for screen printing to use in a thin-film type electronic device, as well as to a resin composition for constituting an insulating film for use in a thin-film electronic device.

The present invention also relates to a solar cell comprising the resin composition above.

2. Description of the Prior Art

In a thin-film type electronic device (i.e., an electronic device constructed by principally stacking thin films) such as a thin-film solar cell, various types of resin composition have been studied for forming an insulating film for use as an interlayer dielectric film in a multilayered structure or an insulating film in a multi-level crossed interconnection.

The resin composition above should possess insulating properties for use as an interlayer insulating film, adhesiveness to adhere the upper and the lower layers, weathering resistance, moistures resistance, heat resistance, wear resistance, resistance against scratches, flexibility, surface hardness, coating applicability of an ink by means of screen printing and the like, and hardenability.

Studies have been made heretofore on thermosetting, thermoplastic, or ultraviolet (UV) curable resin compositions such as styrene resins, saturated polyester resins, unsaturated polyester resins, epoxy resins, alkyd resins, silicone resins, acrylic resins, and fluororesins. Details on the studies as described in, for example, JP-A-61-218625 (the term "JP-A-" as referred herein signifies an "unexamined published Japanese patent application").

However, in spite of the proposed resin composition above, a resin composition which satisfies the requirements with good balance is yet to be developed.

Particularly, in a multilayered structure comprising stacked thin films such as that in a solar cell or a like thin-film type electronic device with an interlayer insulating film or an insulating film for multi-level crossed interconnections, none of the known resin compositions was found to satisfy the required characteristics enumerated above as well as other characteristics concerning printability of an ink, the hardenability of the printed film, and productivity. Accordingly, no resin composition developed heretofore is suitable for use as an interlayer insulating film or an insulating film for multi-level crossed interconnections.

Furthermore, an extensive study has been made of the resin encapsulant for thin-film electronic devices, especially the resin composition that forms a transparent protective film on the surface of a solar cell of thin-film structure.

The resin composition for such use needs not only transparency but also many characteristic properties required for protective film (such as weather resistance, moisture resistance, heat resistance, wear resistance, scratch resistance, flex resistance, surface hardness, and adhesion to substrate and thin film). It also needs a good printability when used in the form of ink for screen printing.

Conventional resin components for transparent protective film are formed from a variety of thermoplastic and thermosetting resins and UV-curing resins, such as styrene resin, saturated polyester resin, unsaturated polyester resin, epoxy resin, silicone resin, acrylic resin, and fluoroplastics. Their detailed descriptions will be found in Japanese Patent Publication No. 173342/1988 and Japanese Patent Laid-Open Nos. 69874/1981 and 218625/1986.

However, none of the conventional resin compositions meet requirements for the above-mentioned characteristic properties. Especially when used for transparent protective film on solar cells of thin film structure, they are not satisfactory in transparency, properties required of protective film, printability of ink, curability, and productivity.

SUMMARY OF THE INVENTION

An object of the present invention is to provide a resin composition for forming an insulating film or a transparent protective film suitable for a thin-film type electronic device structure, and particularly, to provide a resin composition for fabricating an insulating film suitable for an amorphous silicon solar cell utilizing a flexible resin substrate, yet, with high productivity and utilizing an inexpensive and lightweight base material.

An object of the present invention is, more specifically, to accomplish the improvements below by overcoming the problems.

(1) Improving moisture resistance and water resistance of the insulating film

An object of the present invention is to improve the moisture resistance and water resistance of the resin composition constituting an insulating film, thereby improving weathering resistance of the resin composition.

The transparent resin composition should have good resistance to deterioration by moisture, adequate ability to prevent the penetration of moisture into the inside covered by the transparent protective film comprising the transparent resin composition, and high weathering resistance.

Conventional resin compositions suffered changes in composition due to the reaction with the moisture or water of the surroundings. As a result, due to the deterioration of the amorphous silicon phase or to the denaturation of the electrode material, a solar cell using the resin was found to lose the photoelectric conversion effect and to deteriorate the electric properties with passage of time.

(2) Improving heat resistance and surface hardness of the insulating film

Another object of the present invention is to increase the heat resistance and the hardness of an insulating film comprising the resin composition. More specifically, in the fabrication of a thin-film electronic device such as a solar cell, a flexible printed circuit (FPC) is provided or a lead wire is adhered to the electrode portion that is provided to externally take out the electric power by applying heat under pressure at a temperature of 100° C. or higher for soldering or heat sealing. At the same time, the interlayer insulating film and the multi-level crossed insulating films or an insulator around electrodes are also subjected to heat shock or thermal welding.

The thermal deformation of the insulating films due to heat shock or thermal wedding can be prevented from occurring by increasing the hardness and the heat resistance of the insulating films or transparent protective films. Furthermore, insulating failure and defective appearance can be avoided.

Moreover, the heat resistance of the interlayer insulating film and the multi-level insulation film can be further improved in a device in which heat accumulation occurs during the operation of the device, or in a device which is exposed to a heat at high temperature, such as a car-use solar cells and the like.

Furthermore, in case of forming an ITO (indium tin oxide) transparent electrode, the insulating properties can be maintained by preventing physical or chemical damage from occurring on the printing film and thereby increasing heat resistance of the film.

Vehicle-mounted solar cells, which are subject to high temperatures, are protected from failure and surface scratches, which reduce light transmission and hence conversion efficiency, if they are covered with a protective film having improved hardness and heat resistance (3) Improving wear resistance A still other object of the present invention is to improve the wear resistance of an insulating film comprising the resin composition.

In case of laminating thin films by means of, particularly, a roll-to-roll process (a fabrication process which comprises continuously forming the device and the like by performing each of the unit operations such as film deposition, printing, and laser processing while taking up a rolled flexible substrate with another roll), there are problems such as of scratches and the like which generate on the interlayer insulating film or the transparent surface protection film when the surfaces of the upper layer and the lower layer of the flexible substrates are rubbed against each other, or when the surfaces of the flexible substrate and the guide roll are rubbed against each other.

It is therefore necessary to maintain wear resistance to prevent, for instance, inhomogeneity from occurring on an inorganic thin film such as an amorphous silicon film, a loss in performance, and a drop in production yield due to a defective appearance.

Improvement on durability in transparency:

Conventional curable resin compositions developed so far to meet the above-mentioned requirements (1) to (3) are liable to discoloration (which decreases transparency) due to attack by heat, moisture, UV light ozone, etc. when used for outdoor solar cells. The transparent resin composition should give a protective film which retains its transparency for a long period of time.

(5) Improving adhesiveness between the upper and the lower layers

A yet other object of the present invention is to improve the adhesiveness between an insulating film comprising the resin composition and the upper and the lower layers adjacent thereto.

In a multilayered thin film device, for instance, an amorphous silicon solar cell using a low-cost flexible substrate such as a resin substrate or a metallic substrate as the base material, a flexible insulating resin composition which assures excellent adhesiveness between layers (adhesiveness between the insulating film and the adjacent upper and lower layers) is required to achieve an insulation between an upper and a lower stacked thin film (layer) under various environments which accompany bending of the thin film device.

It is also required to relax the internal stress to prevent deformation or change in size, such as curling, of the flexible solar cell comprising a stacked structure of a thin film having a large internal stress such as an amorphous silicon layer and an ITO transparent electrode layer.

(6) Improving laser processability

Another object of the present invention is to improve laser processability of an insulating film comprising the resin composition.

To implement a multilayered thin film device comprising a multi-level insulation and a multi-level interconnection established in high precision, processing such as a laser scribing or a laser bonding using a YAG laser and the like is indispensable. Thus, the resin composition constituting the insulating film must be designed as such to be successfully cut at high precision.

(7) Improving hardenability

A still other object of the present invention is to lower the thermosetting temperature of a resin composition or a transparent resin composition as possible without impairing the degree of cross linking, yet elongating the pot life in its ink state.

Concerning productivity in forming a resin composition in printing to obtain an insulating film or a transparent film, it is advantageous if the thermosetting reaction proceeds efficiently at a temperature as low as possible, and if the pot life of the ink is long.

Particularly, in case of a flexible solar cell and the like in which a plastic film having low thermal resistance is used, an insulating resin composition or a transparent resin which undergoes thermosetting at a lower temperature is important in preventing thermal deformation from occurring on a solar cell.

The present invention achieves the objects of the present invention shown representatively in (1) to (7) above.

According to an aspect of the present invention, there is provided a resin composition obtained by mixing a first component comprising a polyfunctional isocyanate compound; and a polyol based second component comprising polymers or oligomers having reactive hydroxyl groups which react with isocyanate groups to principally form urethane bonds.

In accordance with another aspect of the present invention, there is provided a resin composition as above, characterized in that the first component comprises a blocked polyfunctional isocyanate compound which releases an isocyanide group upon heating.

In accordance with a still aspect of the present invention, there is provided a resin composition as above, characterized in that the second component comprises a single system or a mixed system of a phenoxy resin or a biphenol-type epoxy resin having a number average molecular weight of 1,200 or more but 50,000 or less.

In accordance with a yet other aspect of the present invention, there is provided a resin composition as above, characterized in that the second component comprises a single system or a mixed system of a phenoxy resin or a bisphenol-type epoxy resin having a number average molecular weight of 2,500 or more but 20,000 or less.

In accordance with a further other aspect of the present invention, there is provided a resin composition as above, characterized in that an additive comprising a silicone-based or an acrylic-based polymer, or a polymer of mixed system thereof is added at a quantity of from 0.001 to 5% by weight with respect to the resin composition comprising the first and the second components.

In accordance with another aspect of the present invention, there is provided a resin composition as above, characterized in that a composite is formed by adding fine particles of at least one selected from the group consisting of $SiO_2$, $Al_2O_3$, $TiO_2$, $CaCO_3$, and carbon black as fine pigment particles.

In accordance with a yet other aspect of the present invention, there is provided a solar cell comprising a resin composition above.

The present invention provides a highly reliable flexible resin composition particularly useful as an interlayer insulating film. The resin composition according to the present invention is obtained by forming, as represented by phenoxy resin, a polyol of an insulating polymer or oligomer which is resistant against hydrolysis and characterized in that it comprises a bisphenol skeleton with a rigid aromatic ring and an ether bond for rendering the structure flexible as the principal chain, said principal chain provided with reactive hydroxyl groups at high concentration; preparing a resin lacquer containing a polyurethane bond obtained by reacting the resulting polyol with a polyfunctional isocyanate or a block compound thereof in a stoichiometric quantity or in a quantity slightly in excess than stoichiometry; and obtaining a resin composition by dispersing together with a dispersing agent into the resulting lacquer, a thixotropic imparting agent such as a fine-grained $SiO_2$ (aerosil), a dye, and a laser radiation absorbing agent such as carbon black having high electric resistivity.

The surface tension of the resin composition in the form of a paste before hardening is controlled to a value of 40 $\mu$N/cm (at 20° C., as measured according to ASTM D971 by means of platinum ring method using Dynometer manufactured by Bicchemie Co., Ltd.) or lower by adding a defoaming agent, a leveling agent, etc.

In accordance with the present invention, an adduct, a biuret, an isocyanurate (a trimer), etc., of an isocyanate monomer and trimethylol propane (TMP) is effective as a polyfunctional isocyanate compound for use as a first component.

As isocyanate monomers most generally known as the aromatic compound, there can be mentioned toluene diisocyanate (TDI), 4,4'-diphenylmethane diisocyanate (MDI), or xylene diisocyanate (XDI). An adduct, a biuret, an isocyanurate (a trimer), etc., of the monomers above can be used in the present invention as an aromatic polyfunctional isocyanate.

However, an aromatic polyfunctional isocyanate is higher in reactivity as compared with an aliphatic (non-aromatic) compound. It can be expected to completely harden at a lower temperature, however, the pot life thereof is very short when used as an ink, a paste as a solder resist, or a two-liquid type product by mixing it with a second component polyol. It therefore has difficulties in handling.

Other isocyanate monomer free of aliphatic groups (having no aromatic rings) include hexamethylene diisocyanate (HDI), isophorone diisocyanate (IPDI), hydrogenated MDI ($H_{12}$MDI), and hydrogenated XDI. The aliphatic (non-aromatic) polyfunctional isocyanates of the adduct, biuret, isocyanurate, etc., of TMP with the monomers above are low in reactivity as compared with an aromatic one, however, are advantageous in increasing device reliability against environment, such as the resistances to light, weathering, etc. Accordingly, they are suitable for uses where resistance against yellowing is required, or where transparency or translucency is necessary.

Although the aliphatic isocyanate above is reacts more sluggishly as compared with an aromatic one, a longer pot life can be obtained when used as an ink (an overcoating agent) or a paste as a solder resist and the like. This ease in handling in production steps is another merit of the aliphatic product.

In accordance with another aspect of the present invention, a transparent resin composition which comprises two components mixed therein, the first one being a transparent polyfunctional isocyanate compound having no aromatic rings and the second one being a transparent polyol, in the form of polymer or oligomer, having reactive hydroxyl groups to form urethane linkages upon reaction with isocyanate groups.

Also, in the above transparent resin composition, the first component is a blocked polyfunctional isocyanate compound having no aromatic rings, which liberates isocyanate groups upon heating.

Also, in the above transparent resin composition, the second component is a phenoxy resin or a bisphenol-type epoxy resin or a mixture thereof which has a number-average molecular weight in the range of 1200 to 50000.

Also, in the above transparent resin composition, wherein the second component is a phenoxy resin or a bisphenol-type epoxy resin or a mixture thereof which has a number-average molecular weight in the range of 2500 to 20000.

Also, in the above transparent resin composition, it further comprises an additive in an amount of 0.001–5 wt % which is a silicone polymer or an acrylic polymer or a mixture thereof.

Also, the transparent resin composition in accordance with the present invention is particularly advantageous for solar cells.

The present invention is designed to form a transparent protective film from a transparent resin composition which is composed of a polyfunctional isocyanate compound and a polyol. The isocyanate compound is one which has no conjugated bonds and is or is not blocked. The polyol is either a polymer or an oligomer typified by a high-molecular weight phenoxy resin having reactive hydroxyl groups. It is transparent and resistant to hydrolysis and has rigid main chains. Reaction between the isocyanate compound and the polyol (with hydroxyl groups in a stoichiometric amount or in an excess amount) give rise to a product having polyurethane linkages which serves as the protective film.

Further, the surface tension of the paste used during the film application is controlled to be 40 $\mu$N/cm or less (20° C.) (platinum ring method using dynometer produced by BYK-Chemie GmbH company under the conditions of ASTM D971) by additive agent such as antifoaming agent or leveling agent.

According to the present invention, the first component of the transparent resin composition may be a polyfunctional isocyanate compound having no aromatic rings. It includes diisocyanate, such as hexamethylenediisocyanate (HDI), and triisocyanate. Examples of the latter include an adduct of trimethylolpropane with three HDI molecules, a trimer of HDI joined by urea linkages (or biuret linkages), and a trimer of HDI forming an isocyanurate. (The last one yields a polyurethane resin superior in weather resistance and heat resistance.) Additional examples of the isocyanate compound having no aromatic rings include isophoronediisocyanate (IPDI). This isocyanate has weather-resistance and heat-resistance as in HDI, and is effective in obtaining a hard polyurethane resin, and has a long pot life when mixed with a polyol.

This IPDI forms an adduct with TMP as in HDI, and forms an isocyanurate as a trimer, and is effective in obtaining an excellent polyurethane resin as a trifunctional isocyanate.

Hydrogen added diphenylmethandiisocyanate ($H_{12}$MDI) is effective as an isocyanate having no aromatic ring, and a polyfunctioned isocyante can be used.

Preferred representative examples for the block polyfunctional isocyanate compound (block isocyanate) for use as the first component of the above insulating resin component or transparent resin component contain an active hydrogen. Principal example is a compound (which releases free isocyanate groups by heating at a temperature of from 160 to 180° C. for a duration of 30 minutes) comprising isocyanate groups blocked with hydroxyl groups originated from a block agent such as phenol, cresol, and isononyl phenol. By mixing it with a polyol in such a manner that free isocyanate be in an equivalent quantity with the hydroxyl groups in polyol, a one-liquid type product can be obtained needless of taking the pot life into consideration.

A curing catalyst such as dibutyltin dilaurate or a dissociation catalyst such as triethylenediamine (DABCO) may be added in a small quantity in preparing the resin.

An oxime such as methyl ethyl ketoxime can be mentioned as another example of a block agent (which dissociates by heating at about 140° C. for a duration of 30 minutes).

A block agent comprising a lactam group such as ∊caprolactam, or such comprising an amino group, an amide group, or an imide group can be used as well (these thermally dissociate by heating at about 160° C. for a duration of 30 minutes).

Furthermore, a dicarbonyl compound such as diethyl malonate or ethyl acetoacetate is also effective as a block agent. Because a block agent of this type dissociates the isocyanate groups at a lower temperature (i.e., by heating at about 100° C. for 30 minutes), it can be used advantageously as a one-liquid product having an intensified thermosetting property.

The polyfunctional isocyanide compounds described above functions effectively as the isocyanate compounds to be combined with the block agents above. An aromatic isocyanate can be used, because no urethane reaction occurs at an ordinary temperature in case it is mixed with a polyol of the second component. Accordingly, the resulting product can be used as a one-liquid type pot life-free ink (overcoat agent), a solder resist, etc.

Furthermore, among the isocyanate compounds to be combined with these blocking agents, the above-described polyfunctional isocyanate compound having no aromatic ring is practically preferable to keep transparency.

Polyol for use as the second component comprises a single system or a mixed system of a phenoxy resin or a bisphenol-type epoxy resin having a number average molecular weight of 1,200 or more but 50,000 or less, and preferably, 2,500 or more but 20,000 or less.

In the second component, when a material of a low degree of polymerization such those having a number average molecular weight 1200 or less, the proportion of the reactive hydroxyl group decreases and the crosslinking density of the urethane bonding between the first and second component decreases.

As a result, the obtained resin component can not sufficiently exhibit the strong adhesivity with an underlying surface or the strong wear resistance or flexibility which are caused by urethan bond radicals. Also, there is a tendency that the printability of the resin component as an ink for screen printing decreases since the viscosity and elastic modululs decreases.

In particular, the viscosity and the elastic modulus decreases in the case of a transparent resin component which is not added with a pigment, making it more difficult to be printed.

Accordingly, it is preferable that the second component has its number average molecular weight not lower than 1200, more preferable, not lower than 2500.

For example, it is effective to use a material having a bisphenol A-type epoxy structure unit of which degree of polymerization is not lower than 4 and having four or more of reactive hydroxyl groups in each of which one principal molecular principal change is arranged in a pendent form. In this case, the molecular weight is about 1350.

Also, if the number average molecular weight of the second exceeds 50000, the kinds of solvents that can be used are limited. Even if it can be solved, the viscosity of the solution tends to be high and the flowability is low. As a result, it is difficult to make an ink for screen printing is difficult.

For example, when a screen printing is used with an ink of which main component is a material having a bisphenol A-type epoxy structure unit having a high degree of polymerization and having a molecular weight exceeding 50000, it is difficult for the ink to pass through the mesh of a screen having a desired fine pattern.

Also, because of the high viscosity, there is no defoaming effect with respect to enclosed bubbles when using a silicon containing defoaming agent as an additive and because it exhibits a strong consistency, it is almost impossible to uniformly mix such a second component and a polyfunctional isocyanate having no aromatic ring as a first component, resulting in that it is extremely difficult to form an urethane resin component having urethane bonds uniformly arranged.

Accordingly, in the case where using the second component having a high degree of polymerization alone, it is effective if the number average molecular weight is not higher than 50000, preferably not higher than 20000 in order to effectively utilize the characteristics of the urethane resins in view of the printability as a screen printing ink and the ease of handling.

Also, in the case where mixed resins having different molecular weights are used as a second component, it is desirable for the same reasons that the number average molecular weight is in the range of 1200 to 50000, more preferably, not lower than 2500 and not higher than 20000.

For example, phenoxy resins produced by Union Carbide Corp., such as PKHC (having a number average molecular weight of about 14,000), PKHH (having a number average molecular weight of about 15,400), or PKHJ (having a number average molecular weight of about 18,700), and Phenoade YP=50, a phenoxy resin produced by Tohto Kasei K. K may be used.

To control the suitability for printing an ink or forming a film with an ink, a bisphenol-type epoxy resin produced by Shell Kagaku K. K., such as epikote 1007 (having a number average molecular weight of about 2,900) or epikote 1009 (having a number average molecular weight of about 3,750), can be used effectively either singly or as a mixture with a phenoxy resin.

In case of utilizing the resin composition having a polyurethane bond as above as, for example, an interlayer insulating film or a transparent protective film in a flexible solar cell by uniformly forming the desired pattern by screen printing, the defoaming properties and the leveling properties of the ink (paste), as well as the wetting properties with respect to the underlying amorphous silicon film, ITO electrically conductive film, transparent insulating film, etc., must be improved. Preventing pinholes from generating and avoiding repelling of ink, as well as improving the suitability to re-coating are also important factors for realizing a higher uniformity and decreasing refuse rate of the solar cell.

As an effective means for satisfying the aforementioned requirements for a resin composition, from 0.001 to 5% by weight with respect to the resin components (the first and the second components) of a silicone based, acrylic based, or vinyl ester based additive is added if necessary to more favorably maintain screen printability of the resin ink.

Concerning a silicone based additive, for instance, it is effective to mix a trace quantity of a methylalkyl polysiloxane type silicon compound which is partially polyether-modified, an alkyl-modified compound, or a polyester-modified dimethyl polysiloxane.

Particularly, in case of a silicone based deforming agent or a leveling agent, an alkyl-modified compound of methylalkyl polysiloxane as shown in chemical formula (I) below was found favorable.

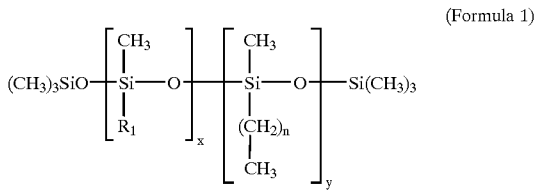

(Formula 1)

Not only silicone compounds, but also acrylic or polyvinyl ether based oligomers or polymers (having a number average molecular weight of about 20,000 or less) added in a small quantity were found effective. In case of uniformly coating an insulating ink (e.g., a solder resist, overcoat agent, etc.) at high precision according to the desired pattern by means of screen printing, it is especially important to control the fluid properties of the ink, and particularly the thixotropy. Favorable results can be obtained by uniformly dispersing particularly fine particles of a pigment in the resin composition.

Effective fine-grained pigments include $SiO_2$ (for instance, Aerosil produced by Degussa Corp.), $Al_2O_3$, $TiO_2$ and high resistivity carbon black. Particularly favorable are the fine particles having a primary particle diameter in a range of from about 5 to 30 nm.

Among the fine-grained pigments above, carbon black absorbs laser radiation. Accordingly, carbon black is also effective in improving suitability of the resin to laser scribing or laser cutting.

The point in preparing an ink (paste) is to sufficiently disperse the fine-grained pigment in the resin component provided for preparing an ink (particularly, the second component). The addition of a polymer based dispersant which less transfers to the printed film surface was found effective.

Examples of the dispersant include polymer dispersants soluble to the second and the first components of the resin composition, and having, on the terminal of the polymer (i.e., an acrylic resin or a polyester resin), a proton-donating groups such as —COOH, —$SO_3$, —P(O), $(OH)_2$, or —OH; a proton-accepting group such as the salts of the proton-donating groups enumerated above, —$NH_2$, —NHR, —NR, or $R^2$, and furthermore a polar group having an ion pair bond such as a quaternary ammonium group.

The fine-grained pigment is preferably added at a concentration of from 3 to 20% by weight with respect to the total of the resin composition components (the total of first component, second component, fine-grained pigment, and solvent). The dispersant is functions effectively by adding it at a concentration of from 1 to 5% by weight with respect to the total of the resin composition components.

DETAILED DESCRIPTION OF THE PREFERRED EMBODIMENTS

Figure 1A:
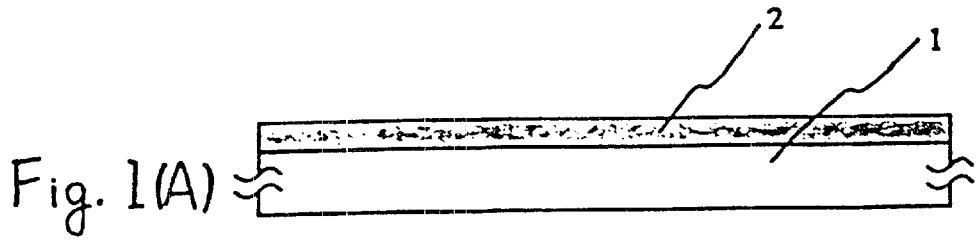
FIGS. 1 (A) to 1 (D) are a diagram showing process steps for fabricating a flexible amorphous silicon solar cell according to an embodiment of the present invention.

The present invention is described in further detail below by making reference to the preferred embodiments according to the present invention. It should be understood, however, that the present invention is not to be construed as being limited to the examples below.

In the Examples 1–5, solar cells of a thin film type electronic device module structure are fabricated using polyethylene naphthalate for the flexible substrate. By means of screen printing, pastes of the resin compositions are each applied according to their individual printing patterns as an upper layer of an amorphous silicon film or an ITO transparent electrically conductive film. The resulting multilayered structure are each overcoated to obtain flexible solar cells, and are subjected to device evaluation. In the Examples below, each of the thin films are formed in-line by a roll-to-roll process to obtain a layered structure.

EXAMPLE 1

A polyurethane based thermosetting resin according to the present invention is used in this Example. The resin comprises the following components:
Second Component:
  Phenoxy resin PKHH 20 pts. by weight (a product of Union Carbide Corp., having a number average molecular weight of about 15,400 and containing 6% by weight of hydroxyl groups)
Solvent:
  Cyclohexanone 40 pts. by weight
  Isophorone 20 pts. by weight
Pigment:
  High resistivity Carbon Black: 4 pts. by weight (a product of Degussa Corp. 25 nm in average particle diameter)
Fine Particles:
  Aerosil 10 pts. by weight (a product of Degussa Corp., 15 nm in average diameter)
Dispersant:
  Oleic acid 3 pts. by weight
Additives
  Defoaming agent KS-69, 0.5 pts. by weight (a product of Shin-Etsu Silicone Co., Ltd.)
  Leveling agent KS-66, 1 pt. by weight (a product of Shin-Estu Silicone Co., Ltd.

After completely dissolving phenoxy resin in a mixed solvent (cyclohexanone and isophorone), carbon black, Aerosil, and the dispersant are added and dispersed for a duration of 48 hours using a zirconia ball mill. Then, the defoaming agent and the leveling agent are added to the resulting dispersion and mixed further for 2 hours.

By adding 17 pts. by weight of an isocyanurate bond hexamethylene diisocyanate (HDI trimer) as a first component to the resulting mixture above in such a manner that the isocyanate groups may be present in stoichiometric quantity with hydroxyl groups in the phenoxy resin and further mixing the resulting product for 20 minutes, a resin composition is obtained in the form of a paste.

A flexible amorphous silicon solar cell having an electrode structure as shown in FIGS. 1 (A) to 1 (D) is fabricated thereafter by using the resulting paste resin composition.

Referring to FIG. 1 (A), an electrode 2 comprising aluminum or a layered structure of aluminum and stainless steel is formed on a polyethylene naphthalate flexible substrate 1.

Then, as shown in FIG. 1 (B), an amorphous silicon layer 3 having a PIN junction and the like and which exhibits photovoltaic effect is formed by means of plasma CVD. The paste of the resin composition obtained above is printed on the upper layer portion of the amorphous silicon film by using a 150-mesh polyester screen, and is thermally set in an oven by heating at 160° C. for a duration of 10 minutes. Thus is obtained a first interlayer insulating film 4.

By means of Ar gas sputtering, an ITO (indium tin oxide) film is deposited on the first interlayer insulating film 4 thus obtained to provide a transparent electrode layer 5.

Even after effecting the sputtering above, no physical or chemical damage is observed on the resin composition provided as a first interlayer insulating film 4.

Then, by using a YAG laser, trenches and holes are formed for insulation or for electric connection. The processing on the first interlayer insulating film 4 is found to be accomplished with high dimensional precision.

Then, the paste resin composition is applied again to the surface of the transparent electrode layer 5 by using a 150-mesh polyester screen, and is subjected to thermal setting in an oven at 160° C. for a duration of 10 minutes.

Referring to FIG. 1 (C), a second interlayer insulating film 6 is obtained in this manner. In parts, the resin composition is formed in such a manner to fill the trenches and holes formed by laser processing.

No flaws and the like is observed to generate on the interlayer dielectric films 4 and 6 during the process steps above conducted according to a roll-to-roll process.

Referring to FIG. 1 (D), an interconnection electrode 7 is printed by using an electrically conductive paste, and a flexible amorphous silicon solar cell is thus obtained by printing and forming a translucent insulating resin film 8.

The performance of the flexible amorphous silicon solar cell thus obtained is evaluated.

Moisture Resistance

Figure 2:
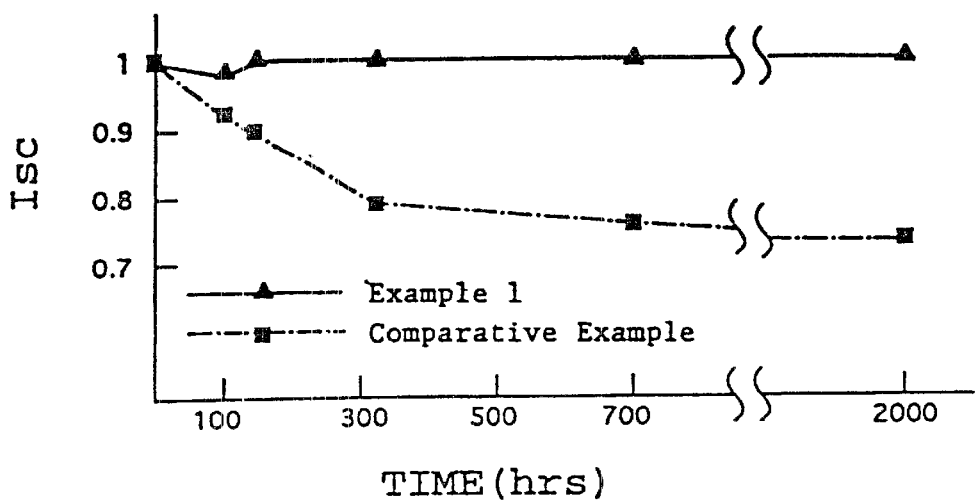
FIG. 2 shows the characteristics of amorphous silicon solar cells obtained in Example 1 according to the present invention and in Comparative Example.
Figure 2:
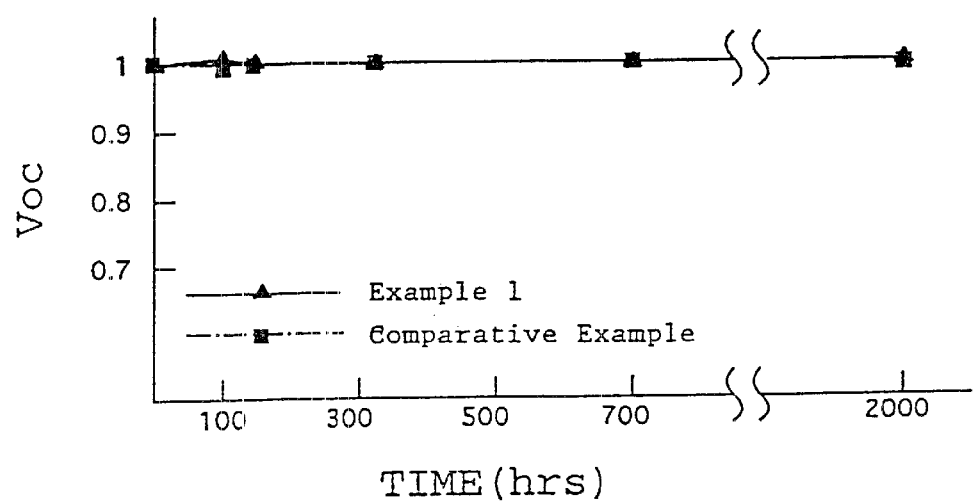
Figure 2:
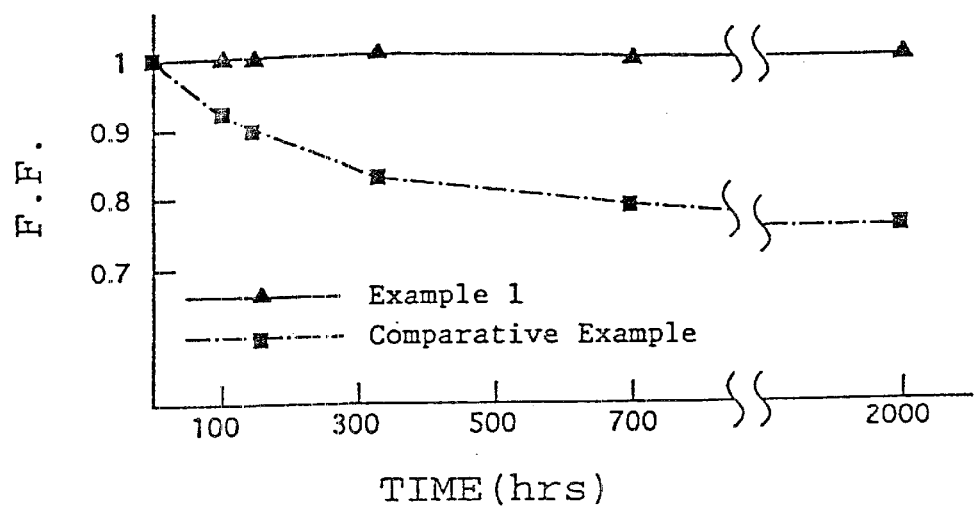

The change in current-voltage characteristics of the solar cell fabricated in the present Example is observed for a duration of 2,000 hours under conditions of 80° C. and 90% RH. The results are illustrated in FIG. 2. Referring to FIG. 2, the ordinate in each of the graphs is expressed by a normalized value. It can be seen from FIG. 2 that the solar cell according to the present invention is substantially free of degradation in short circuit current (Isc), open circuit voltage (Vcc), and curve factor (F. F.) even after passage of 2,000 hours.

Adhesion Strength

Adhesion strength is evaluated on the translucent electrode layer by means of chess-board tape peeling off test. A value of 100/100 obtained in the initial evaluation is found unchanged to yield 100/100 after exposing the solar cell to a temperature of 80° C. at 90% RH for a duration of 2,000 hours.

Glass Transition Temperature (Tg)

Tg is measured by using DSC. Tg to 110° C. and 103° C. are obtained after and before thermal setting, respectively. The drop in elasticity at temperatures of Tg or higher is observed to be very sluggish.

Surface Tension

Surface tension of 37 μN/cm is obtained by means of platinum ring method using a Dynometer at 23° C.

Pot Life

No change in printing suitability is observed even after passage of 24 hours at an ink temperature of 20° C.

COMPARATIVE EXAMPLE

A known thermosetting alkyd resin composition containing the components below is used to fabricate a solar cell similar to that described in Example 1. The performance of the resulting cell is evaluated in the same manner as in Example 1.

Composition of Alkyd Resin

| | |
|---|---|
| Aminoalkyd resin | 12 pts. by weight |
| Melamine resin | 8 pts. by weight |
| Butyl cellosolve | 25 pts. by weight |
| Trimethylbenzene | 25 pts. by weight |
| High resistivity carbon black (a product of Degussa Corp., | 4 pts. by weight 25 nm in average particle diameter) |
| Aerosil (a product of Degussa Corp., | 10 pts. by weight 15 nm in average diameter) |
| Dispersant (Oleic acid) | 8 pts. by weight |
| Defoaming agent TSA-720 (a product of Toshiba Silicone Co., Ltd.) | 1 pt. by weight |
| Leveling agent KS-66 (a product of Shin-Etsu Silicone Co., Ltd.) | 1 pt. by weight |

After completely dissolving aminoalkyd resin and melamine resin in a mixed solvent (butyl cellosolve and benzene), carbon black, Aerosil, and the disperant are added and dispersed for a duration of 48 hours using a zirconia ball mill. Then, the defoaming agent and the leveling agent are added to the resulting dispersion and mixed further for 2 hours.

A flexible amorphous silicon solar cell is obtained in a similar process as described in Example 1 above, and the performance thereof is evaluated.

Moisture Resistance

The short circuit current (Isc) and the curve factor (F.F.) were each observed to deteriorate by 30% with respect to the initial values after passage of 2,000 hours (FIG. 2).

Adhesion Strength

Adhesion strength is evaluated on the ITO layer. A value of 100/100 obtained in the initial evaluation is found to drop to 80/100 after exposing the solar cell to a temperature of 80° C. at 90% RH for a duration of 2,000 hours.

Glass Transition Temperature (Tg)

Tg of 98° C. is obtained after thermal setting.

Surface Tension

Surface tension of 42 μN/cm is obtained by means of platinum ring method using a Dynometer at 20° C.

Pot Life

No problem in printing suitability is observed even after passage of 24 hours at an ink temperature of 20° C.

However, in printing the transparent insulating resin of the uppermost layer, ink is found to be frequently repelled. It can be seen therefore that the resin is inferior concerning recoating properties. As compared with the productivity in Example 1, only 60% of the products with are found acceptable.

EXAMPLE 2

A block isocyanate obtained by active-hydrogen blocking three isocyanate groups in HDI isocyanate using MEK (methyl ethyl ketone) oxime is utilized for the first component, and is added at such a quantity that it may be chemically equivalent to the hydroxyl group content (OH content) accounting for 6% by weight of PKHH (i.e., the second component in Example 1). The resulting mixture is mixed for a duration of 30 minutes in a mixer to obtain a resin composition for use as an overcoat. The other materials are mixed at the same quantity as in Example 1.

The resulting resin composition is used in the trial fabrication of a solar cell in the same manner as in Example 1, and the properties of the resulting cell are evaluated.

Moisture Resistance

The short circuit current (Isc) and the curve factor (F.F.) were each observed to be substantially free of deterioration even after passage of 2,000 hours under conditions of 80° C. and 90% RH.

Adhesion Strength

Adhesion strength is evaluated by means of chess-board tape peeling-off method on the translucent electrode layer. A value of 100/100 obtained in the initial evaluation is found to remain unchanged to yield a value of 100/100 after exposing the solar cell to a temperature of 80° C. at 90% RH for a duration of 2,000 hours.

Glass Transition Temperature (Tg)

Tg is measured by using DSC. Tg of 110° C. and 103° C. are obtained after and before thermal setting, respectively. The drop in elasticity at temperatures of Tg or higher is observed to be very sluggish.

Pot Life

No problem in printing suitability is observed even after passage of 24 hours at an ink temperature of 20° C. Thus, the resin composition can be used pot-life free as a one-liquid type urethane ink.

EXAMPLE 3

Thirty parts by weight of PKHH and 70 parts by weight of a bisphenol A epoxy resin (epikote 1007 produced by Shell Kagaku K.K., having a number average molecular weight of about 2,900 and an OH content of 6% by weight) are mixed to give 100 parts by weight of a mixed resin.

Then, an isocyanate compound of toluene diisocyanate (TDI) is added as the first component for a quantity chemically equivalent to the hydroxyl group content of the resin of the second component. A resin composition for an overcoat is obtained in the same manner as in Example 1 except for the points described above, and the properties of the resulting cell are evaluated.

Moisture Resistance

Almost no change in the short circuit current (Isc) and the curve factor (F.F.) is observed even after passage of 2,000 hours under conditions of 80° C. and 90% RH.

Adhesion Strength

Adhesion strength is evaluated by means of chess-board tape peeling-off method on the translucent electrode layer. A value of 100/100 obtained in the initial evaluation is found to remain almost unchanged to yield a value of 98/100 after exposing the solar cell to a temperature of 80° C. at 90% RH for a duration of 2,000 hours.

Glass Transition Temperature (Tg)

Tg is measured by using DSC. Tg of 103° C. is obtained after thermal setting.

Pot Life

Deterioration in printing suitability is observed to initiate after passage of 24 hours at a temperature of 20° C., and a loss of pattern uniformity and a drop in pattern precision are found.

EXAMPLE 4

Hundred parts by weight of a polycarbonate ester having a straight chain aliphatic carbonate structure with hydroxyl groups on the both terminals thereof, Nipolane 980 (produced by Nippon Polyurethane Industry Co., Ltd., having a number average molecular weight of about 2,000 and an OH value of 56.1) is used as a second component, and is dissolved in 40 parts by weight of a solvent isophorone. A resin composition is prepared in the same manner as in Example 1.

An ink is prepared thereafter by adding IPDI isocyanurate as a hardening agent at a quantity chemically equivalent to the resin. Thus, a solarcell is fabricated in the same manner as in Example 1, and the properties of the resulting cell are evaluated.

Moisture Resistance

Almost no change in the short circuit current (Isc) and the curve factor (F.F.) is observed even after passage of 2,000 hours under conditions of 80° C. and 90% RH.

Adhesion Strength

Adhesion strength is evaluated by means of chess-board tape peeling-off method on the translucent electrode layer. A value of 100/100 obtained in the initial evaluation is found to remain almost unchanged to yield a value of 95/100 after exposing the solar cell to a temperature of 80° C. at 90% RH for a duration of 2,000 hours.

Glass Transition Temperature (Tg)

Tg is measured by using DSC. Tg of 115° C. is obtained after thermal setting.

Pot Life

Deterioration in printing suitability is observed to initiate after passage of 24 hours at a temperature of 20° C. The pot life of the resin composition of the present Example is found to be longer than that of the resin composition described in Example 1.

EXAMPLE 5

In the present Example, the compounds below are used as additives.

Dispersant 3 pts. by weight (Sulfonic acid terminated acrylic copolymer, i.e., a 90:9.5:0.5 (by molar) butyl acrylate/methyl methacrylate/sulfonic acid monomer; having a number average molecular weight of about 9,900 and a solid content of 50% by weight in isophorone solution)

Defoaming agent 0.2 pt. by weight (an aralkyl-modified methylalkyl polysiloxane of formula (I), where $R_1$ represents a structure expressed by formula (II) and n is 5)

$$R_1: -(CH_2)_5, \text{n:5} \qquad \text{(Formula 2)}$$

Leveling agent 0.8 pt. by weight (an aralkyl-modified methylalkyl polysiloxane of formula (I), where $R_1$ represents a structure expressed by formula (III) and n is 8)

$$R_1: -(CH_2)_8, \text{n:8} \qquad \text{(Formula 3)}$$

Alumina 10 pts. by weight (Aluminum Oxide C, a product of Degussa Corp., 13 nm in average diameter)

High resistivity carbon black 4 pts. by weight (a product of Degussa Corp., 25 nm in average particle diameter)

In a manner similar to that described in Example 1, the above additives are dispersed for a duration of 48 hours using a zirconia ball mill. Then, the defoaming agent and the leveling agent are added to the resulting dispersion and are mixed and dispersed further for 2 hours.

A resin component for an overcoat is prepared in the same process as that described in Example 1 by adding a trimethylol propane (TMP) adduct of isophorone diisocyanate (IPDI) at such a quantity that the isocyanate groups may be chemically equivalent to the OH groups contained in PKHH.

A flexible amorphous solar cell is fabricated in the same manner as in Example 1 by means of a roll-to-roll process, and the properties of the resulting cell are evaluated.:

Moisture Resistance

The short circuit current (Isc) and the curve factor (F.F.) were each observed to deteriorate by about 26% with respect to the initial values after passage of 2,000 hours at 80° C. and 90% RH.

Adhesion Strength:

Adhesion strength is evaluated by means of chess-board tape peeling-off method on the translucent electrode layer. A value of 100/100 obtained in the initial evaluation is found to remain unchanged to yield a value of 100/100 after exposing the solar cell to a temperature of 80° C. at 90% RH for a duration of 2,000 hours.

Glass Transition Temperature (Tg):

Tg is measured by using DSC. Tg of 113° C. is obtained after thermal setting.

Pot Life:

Deterioration in printing suitability is observed to initiate after passage of 24 hours at a temperature of 20° C. The degree of deterioration is better than that in Example 1, and is about the same as that in Example 4.

Figure 3:
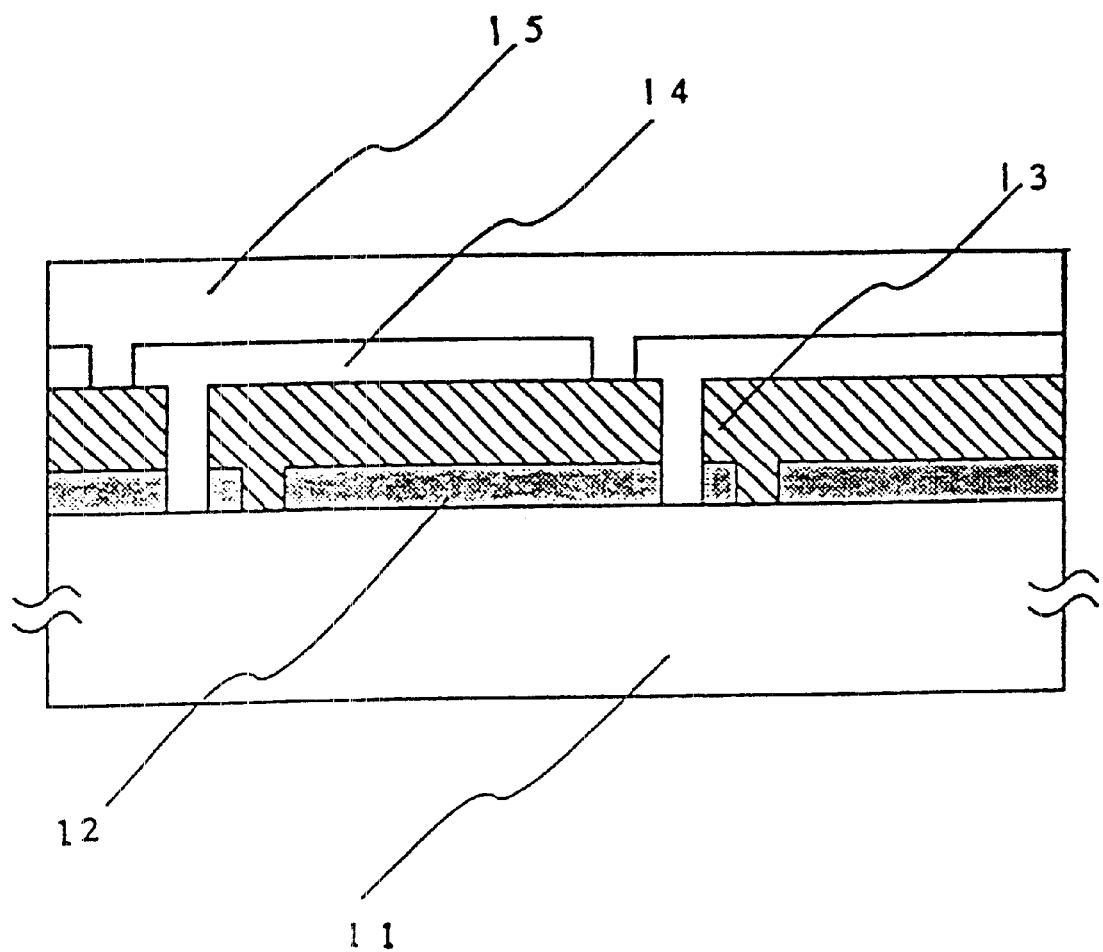
FIG. 3 shows an example of an amorphous silicon solar cell.

In examples 6 to 8 that follow, a transparent resin composition was prepared and it was made into a transparent protective film for amorphous silicon solar cells of thin film structure as shown in FIG. 3. A cross-sectional structure of an amorphous Si solar cell having a thin film type electronic device structure is shown in FIG. 3. The solar cells and the protective film were formed in-line by the roll-to-roll process.

The solar cell shown in FIG. 3 is formed on a flexible substrate 1 of polyethylene terephthalate. It is composed of a lower electrode 12 (which is aluminum thin film), a photoelectric conversion layer 13 (which is amorphous silicon thin film), and a transparent upper electrode 14 (which is indium-tin oxide film). These layers were patterned by the laser scribe technique.

Except a small area for electrodes for power output, the entire surface (or the transparent upper electrode layer 14) of the solar cell was covered with a transparent protective film 5, which was formed by screen printing from the transparent resin composition 15 of the present invention. The screen printing was followed by leveling for a few minutes and heat curing in an oven at 160° C. for 10 minutes.

EXAMPLE 6

A transparent resin composition of the present invention was prepared as follows:

The first component: Isocyanurate-linked hexamethylene-diisocyanate (HDI trimer, "Coronate HX" containing 21.3 wt % of NCO, a product of Nippon Polyurethane Co., Ltd.)

The second component: Phenoxy resin ("PKHH" having a number-average molecular weight of about 15400 and containing 6 wt % of hydroxyl groups, a product of Union Carbide Corporation). This phenoxy resin (100 pbw) was dissolved in a solvent composed of 100 pbw each of cyclohexanone and isophorone. The resulting solution was incorporated with 5 pbw each of anti-foam agent ("TSA-720", a product of Toshiba Silicone Co., Ltd.) and leveling agent ("KS-66", a product of Shin-Etsu Silicone Co., Ltd.).

The phenoxy resin is completely dissolved in a mixed solvent (cyclohexanon/isophorone) and is sufficiently mixed with antifoaming and leveling agent.

The first component (80 pbw), i.e. isocyanurate bonded hexamethylenediisocyanate (HDI trimer: Nihon Polyurethane Co., Ltd. Coronate NX; NCO containing ratio 21.3 wt %) was thoroughly mixed with the second component (phenoxy resin solution) such that the amount of hydroxyl groups is stoichiometrically equal to that of isocyanate groups.

The resulting resin composition was applied to the surface of the upper electrode by screen printing through a 150-mesh polyester screen. The screen printing was followed by heat-curing in an oven at 160° C. for 10 minutes. The thus obtained transparent protective film was found to have the following 15 properties.

Moisture resistance: high enough to prevent the degradation of the solar cell conditioned at 80° C. and 90% RH for 2000 hours.

Pencil hardness: 4H

Adhesion: (according to cross-cut test)
  100/100 immediately after application to the transparent electrode.
  100/100 after conditioning at 80° C. and 90% RH for 2000 hours.

Glass transition point (Tg) (DSC method): 110° C. for the cured film; 103° C. for the uncured film. Very slow decrease in elastic modulus at temperatures above Tg.

Transparency: The sample remained unchanged in transmission of light having a wavelength of 400 nm after conditioning at 85° C. for 1000 hours.

Yellowing: None

Surface tension: 36 $\mu$N/cm at 20° C. (measured by the platinum ring method, using Dynometer)

Pot life: The ink remained unchanged in printability after standing at 20° C. for 24 hours.

COMPARATIVE EXAMPLE

A transparent resin composition was prepared in order to obtain a protective film. The second component polyol is obtained by sufficiently dissolving and mixing a solvent, antifoaming and leveling agent in the same kind and quantity as in Embodiment 6 to 100 pbw phenoxy resin (PKHH) in the same manner as in Example 1 except that the first and second components were replaced as follows:

The first component: An adduct of toluene diisocyanate (TDI, which has an aromatic ring) and trimethylolpropane (TMP) (which is a trifunctional polyisocyanate, "Coronate L", a product of Nippon Polyurethane Co., Ltd., containing 13.2 wt % of NCO) where the amount of the isocyanate group is equivalent to the amount of hydroxyl group contained in the phenoxy resin. After this component is printed with mesh polyester screen as in Embodiment 6, it is cured in an oven at 160° C. for 10 minutes.

The thus obtained transparent protective film was found to have the following properties.

Pencil hardness: 4H

Adhesion: (according to cross-cut test)
  100/100 immediately after application to the transparent electrode.
  90/100 after conditioning at 80° C. and 90% RH for 2000 hours.

Glass transition point (Tg): 113° C. for the cured film; 103° C. for the uncured film.

Transparency: The sample decreased by 20% in transmission of light having a wavelength of 400 nm after conditioning at 85° C. for 1000 hours.

Yellowing: Significant

Surface tension: 38 $\mu$N/cm at 20° C. (measured by the platinum ring method, using Dynometer)

Pot life: The ink became a gel (and hence incapable of screen printing) after standing at 20° C. for 24 hours.

EMBODIMENT 7

A transparent resin composition was prepared in the same manner as in Embodiment 6 except that the first and second components were replaced as follows:

The first component: A blocked isocyanate prepared by blocking the three isocyanate groups of "Coronate HX" (used in Embodiment 6) with the reactive hydrogen of methyl ethyl ketone oxime.

The second component: Phenoxy resin "PKHH" (100 pbw) dissolved in solvents and incorporated with an anti-foam agent and leveling agent as in Embodiment 6.

The first and second components were thoroughly mixed such that the amount of hydroxyl groups is stoichiometrically equal to that of isocyanate groups.

The resulting resin composition (in the form of ink or paste) underwent screen printing through a 150-mesh polyester screen, which was followed by heat-curing in an oven at 160° C. for 10 minutes.

The thus obtained transparent protective film was found to have the following properties.

Moisture resistance: high enough to prevent the degradation of the solar cell conditioned at 80° C. and 90% RH for 2000 hours.

Pencil hardness: 4H

Adhesion: (according to cross-cut test)
100/100 immediately after application to the transparent electrode; 100/100 after conditioning at 80° C. and 90% RH for 2000 hours.

Glass transition point (Tg): 110° C. for the cured film; 103° C. for the uncured film.

Transparency: The sample remained unchanged in transmission of light having a wavelength of 400 nm after conditioning at 85° C. for 1000 hours.

Yellowing: None

Pot life: The ink remained unchanged in printability after standing at 20° C. for 1 week.

Curability: The ink gave no sign of degradation even after storage at 20° C. for 1 week, as indicated by the fact that the coating film of the ink gave an adequate degree of cross-linking when heat-cured in an oven at 160° C. for 10 minutes.

EMBODIMENT 8

A transparent resin composition of the present invention was prepared as follows:

The first component: Isocyanurate-linked isophorone diisocyanate (IPDI trimer)

The second component: A mixture composed of 30 pbw of phenoxy resin ("PKHH" as used in Embodiment 6) and 70 pbw of bisphenol A-type epoxy resin ($M_n$= 2900, "Epikote 1007", a product of Shell Chemical Co., Ltd.)

This mixture contains 6 wt % of hydroxyl groups.

This mixture (100 pbw) was thoroughly dissolved in a solvent composed of 50 pbw of cyclohexanone and 100 pbw of isophorone. The resulting solution was incorporated with 0.2–0.4 wt % of anti-foam agent and leveling agent, which are silicone compound represented by the formula (4) below.

$R_1$: —$(CH_2)_8$, n:5                       (Formula 4)

The first and second components were thoroughly mixed such that the amount of hydroxyl groups is stoichiometrically equal to that of isocyanate groups.

The resulting resin composition was made into a transparent protective film for solar cells in the same manner as in Example 1.

The thus obtained transparent protective film was found to have the following properties.

Moisture resistance: high enough to prevent the degradation 10 of the solar cell conditioned at 80° C. and 90% RH for 2000 hours.

Pencil hardness: 4–5H

Adhesion: (according to cross-cut test)
100/100 immediately after application to the transparent electrode; 100/100 after conditioning at 80° C. and 90% RH for 2000 hours.

Glass transition point (Tg): 115° C. for the cured film; 95° C. for the uncured film. Very slow decrease in elastic modulus at temperatures above Tg.

Transparency: The sample remained unchanged in transmission of light having a wavelength of 400 nm after conditioning at 85° C. for 1000 hours.

Yellowing: None

Pot life: The ink remained unchanged in printability after standing at 20° C. for 24 hours.

EXAMPLE 9

In this Example, respective thin films were formed, i.e., laid one on another by an in-line, roll-to-roll process.

A polyurethane thermosetting resin according to the invention was used in this Example, and had the following components.

Second component:
Phenoxy resin PKHH, 20 pts. by weight (a product of Union Carbide Corp.; having a number average molecular weight of about 11,000 and containing 6% by weight of hydroxyl groups)

Solvent:
Cyclohexanone, 40 pts. by weight
Isophorone, 30 pts. by weight

Pigment:
High-resistivity carbon black, 4 pts. by weight (a product of Degussa Corp.; 25 nm in average diameter)

Fine Particles:
Aerosil, 10 pts. by weight (a product of Degussa Corp; 15 nm average diameter)

Dispersant:
Oleic Acid, 3 pts by weight

Additives:
Defoaming agent KS-69, 0.5 pt. by weight (a product of Shin-Etsu Silicone Co., Ltd.)
Leveling agent KS-66, 1 pt. by weight (a product of Shin-Etsu Silicone Co., Ltd.)

After phenoxy resin was completely dissolved in a mixed solvent (cyclohexanone and isophorone), carbon black, Aerosil, and the dispersant were added and dispersed for 48 hours by using a zirconia ball mill. Then, the defoaming agent and leveling agent were added to a resulting dispersion and they were mixed further for 2 hours.

Hexamethylene diisocyanate [having isocyanurate bonds; multifunctional (trifunctional or more highly functional)] type blocked isocyanate MF-K60X (a product of Asahi Chemical Industry Co., Ltd.; solid components 60% by weight; effective NCO 8% by weight) as a first component was added, to a resulting mixture to establish a condition NCO/OH=1.0 so that the amount of isocyanate groups become stoichiometrically equal to that of hydroxyl groups in the phenoxy resin. A resulting product was mixed for 20 minutes to produce a resin composition in paste form.

A flexible amorphous silicon solar cell having an electrode structure shown in FIGS. 1(A) to 1(D) was fabricated in the following manner by using the above paste resin composition.

First, as shown in FIG. 1(A), an electrode 2 of aluminum or a layered structure of aluminum and stainless steel was formed on a polyethylene naphthalate flexible substrate 1.

Figure 1B:
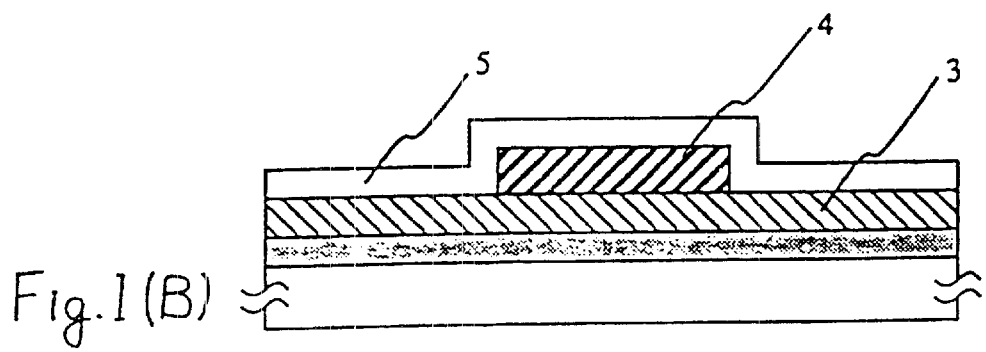

Then, as shown in FIG. 1(B), an amorphous silicon layer 3 having a pin junction or the like and exhibiting the photovoltaic effect was formed by plasma CVD. The paste resin composition obtained above was printed on the upper layer portion of the amorphous silicon layer by using a 150-mesh polyester screen, and then heated in an oven at 110° C. for 30 minutes. The resin composition was thermally set to become an interlayer insulating film 4.

Subsequently, an ITO (indium tin oxide) film as a transparent electrode layer 5 was formed on the interlayer insulating film 4 by Ar gas sputtering. After the sputtering step, no physical or chemical damage was observed on the interlayer insulating film 4 that is a resin composition.

Then, trenches and holes were formed for insulation and electric connection purposes by using a YAG laser. The laser processing on the interlayer insulating film 4 was found to be performed with very high dimensional precision.

Next, the paste resin composition was again applied to the surface of the transparent electrode layer 5 by using a 150-mesh polyester screen, and then heated in an oven at 110° C. for 30 minutes ao as to be thermally set.

Figure 1C:
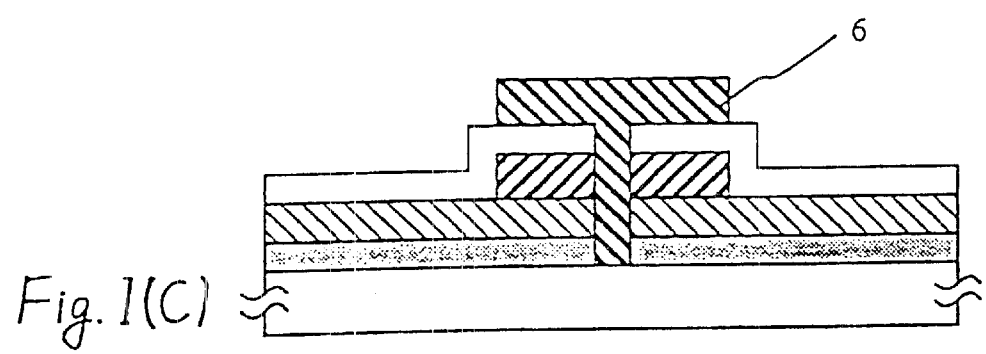

A second interlayer insulating film 6 was formed in this manner as shown in FIG. 1(C). In several portions, the resin composition was filled in the trenches and holes that had been formed by laser processing.

In the steps so far performed, a roll-to-roll process caused no flaws or the like in the interlayer insulating films 4 and 6.

Further, even with the use of blocked isocyanate, sufficient setting performance was obtained at the temperature close to Tg (113° C.) of the polyethylene naphthalate substrate. As a result, a uniform insulating film coverage was maintained even after the second printing of the paste resin composition on the ITO film. The deformation of a roll sheet was slight, and the laser processing was performed with high accuracy.

Figure 1D:
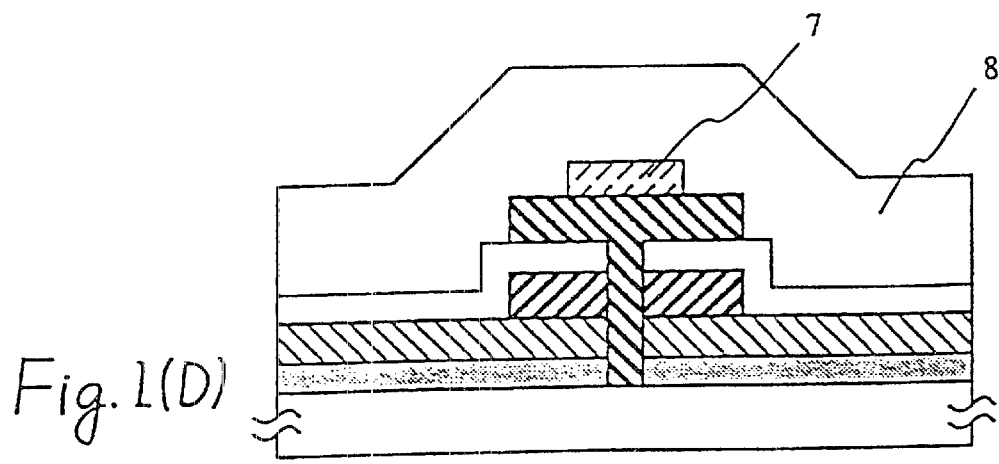

Next, as shown in FIG. 1(D), an interconnection electrode 7 was printed with conductive paste and a transparent, insulative resin film 8 was formed, i.e., printed, to complete a flexible amorphous silicon solar cell.

The flexible amorphous silicon solar cell thus obtained showed the following performance.

Moisture resistance:

The variation in current-voltage characteristic of the solar cell fabricated in the Example was monitored over 2,000 hours in an environment of 80° C. and 90% RH. As in the case of Example 1, the solar cell of this Example was substantially free of degradation in short-circuit current (Isc), voltage of open-circuit (Voc), and curve factor (F.F.) even after a lapse of 2,000 hours.

Adhesion strength (according to chess-board type peeling off test):

100/100 immediately after application to the transparent electrode layer; 100/100 after conditioning at 80° C. and 90% RH for 2,000 hours.

Pot life:

No change in printing suitability was observed even after a lapse of 48 hours at an ink temperature of 20° C.; that is, pot-life free performance was observed.

EXAMPLE 10

To obtain a transparent resin composition, the same composition as in Example 6 was prepared by the same amount by sufficiently dissolving and mixing a phenoxy resin PKHH as a polyol component which is a second component in and with a solvent, defoaming agent, and a leveling agent. Multifunctional blocked isocyanate MF-K60X (HDI series blocked polyisocyanate; used in Example 1) as a first component was added, to a resulting mixture to establish a condition NCO/OH=1.0 so that the amount of isocyanate groups become stoichiometrically equal to that of hydroxyl groups in the phenoxy resin, and they are mixed sufficiently to provide ink (paste).

The resulting ink (paste) was printed by using a 150-mesh polyester screen, and then heated in an oven at 110° C. for 30 minutes so as to be thermally set.

The thus-obtained transparent resin composition showed the following properties.

Moisture resistance:

High enough to prevent the solar cell from being deteriorated in characteristics after being conditioned at 80° C. and 90% RH for 2,000 hours.

Pencil hardness:

4H

Adhesion strength (according to a chess-board tape peeling off test):

100/100 immediately after application to the transparent electrode layer; 100/100 after conditioning at 80° C. and 90% RH for 2,000 hours.

Transparency:

No variation was observed in light transmittance at a wavelength of 400 nm after conditioning at 85° C. for 1,000 hours.

Yellowing:

None

Pot life:

The ink remained unchanged in printing suitability after standing at 20° C. for 1 week. It was confirmed that the ink can be used as a pot-life free urethane ink.

Curability:

An ink coating was again printed after storage at 20° C. for 1 week, and heat-cured in an oven at 110° C. for 30 minutes. The coating showed an adequate degree of cross-linking in spite of the low-temperature curing, and no degradation was observed.

As described in the foregoing, the resin composition according to the present invention is improved in resistance against moisture, heat, wear, and scratches, and is yet improved in surface hardness, adhesiveness, printing suitability, and laser processability.

In particular, a resin composition having excellent productivity and processability satisfying the requirements for an interlayer insulating film of a flexible amorphous silicon solar cell and the like is developed.

Furthermore, the transparent resin composition of the present invention has the following characteristics:

Moisture resistance: High enough to prevent the solar cell from degradation even after conditioning at 80° C. and 90% RH for 2000 hours.

Heat resistance: High enough to prevent thermal deformation and deterioration in insulation and appearance despite the fact that the protective film near the electrodes is subject to heat compression at the time of bonding to lead wires and flexible printed circuits. This effect is due to the high Tg resulting from curing.

Wear resistance, scratch resistance, and surface hardness: Owing to its high surface hardness and wear resistance, the protective film protects the solar cells from scratches which otherwise occur during the roll-to-roll process. This contributes to good appearance and high yields.

Weather resistance: After outdoor exposure test, the protective film did not show yellowing, loss of clarity, and adverse effect on solar cells.

Flex resistance: Flexible solar cells with the protective film remain flexible, with thin films firmly sticking to the substrate, and show no clacking.

Printability: The resin composition in the form of ink has a surface tension lower than 40 $\mu$N/cm at 20° C. owing to the additive (silicone or acrylic compound) in a small amount (0.001–3 wt %) which improves the anti-foaming and leveling properties. With a low surface tension, the ink is suitable for screen printing.

While the invention has been described in detail and with reference to specific embodiments thereof, it will be apparent to one skilled in the art that various changes and modifications can be made therein without departing from the spirit and scope thereof. For example, although solar cells are described as an example, the resin component of the present invention may be used in other types of electronic devices, for example, liquid crystal displays or image sensors and the like.

What is claimed is:

1. An electronic device including at least one solar cell comprising:
    a first electrode formed over a substrate;
    an amorphous silicon layer having a photovoltaic effect formed on the first electrode;
    an interlayer insulating film formed on a portion of said amorphous silicon layer;
    a transparent electrode formed on said amorphous silicon layer and said interlayer insulating film;
    wherein said interlayer insulating film is formed by applying a resin mixture and curing with heat, said mixture comprising:
        a first component comprising a polyfunctional blocked isocyanate compound wherein a dicarbonyl compound is used as a block agent, which dissociates an isocyanate group upon heating; and,
        a second component comprising a polyol comprising polymers or oligomers having reactive hydroxyl groups which react with isocyanate groups to form urethane bonds.

2. The electronic device of claim 1 wherein said dicarbonyl compound is a diethyl malonate or an ethyl acetoacetate.

3. The electronic device of claim 1 wherein the second component comprises a phenoxy resin or a bisphenol epoxy resin having a number average molecular weight of 1,200 to 50,000.

4. The electronic device of claim 1 wherein the second component comprises a phenoxy resin or a bisphenol resin having a number average molecular weight of 2,500 to 20,000.

5. The electronic device of claim 1 wherein said resin mixture is added with at least one material selected from the group consisting of a silicone-based polymer, an acrylic-based polymer and a mixture thereof at a quantity of from 0.001 to 5% by weight with respect to the resin composition comprising the first and second components.

6. The electronic device of claim 5 wherein the resin mixture contains particles of at least one selected from the group consisting of $SiO_2$, $Al_2O_3$, $TiO_2$, $CaCO_3$, and carbon black as pigment particles.

7. An electronic device including at least one solar cell comprising:
    a first electrode formed over a substrate;
    an amorphous silicon layer having a photovoltaic effect formed on the first electrode;
    an interlayer insulating film formed on a portion of said amorphous silicon layer;
    a transparent electrode formed on said amorphous silicon layer and said interlayer insulating film;
    wherein said interlayer insulating film is formed by applying a resin mixture and curing with heat, said mixture comprising:
        a first component comprising a transparent polyfunctional blocked isocyanate compound, wherein a dicarbonyl compound is used as a block agent, which dissociates an isocyanate group upon heating; and,
        a second component comprising a transparent polyol, in the form of polymer or oligomer, having reactive hydroxyl groups to form urethane linkages upon reaction with isocyanate groups.

8. The electronic device of claim 7 wherein said dicarbonyl compound is a diethyl malonate or an ethyl acetoacetate.

9. The electronic device of claim 7 wherein the second component is a phenoxy resin or a bisphenol epoxy resin or a mixture thereof which has a number average molecular weight in the range of 1,200 to 50,000.

10. The electronic device of claim 7 wherein the second component is phenoxy resin or a bisphenol epoxy resin or a mixture thereof which has a number-average molecular weight in the range of 2,500 to 20,000.

11. The electronic device of claim 7 wherein said resin mixture comprises an additive comprising at least one material selected from the group consisting of a silicone-based polymer, an acrylic-based polymer, and a mixture thereof, in an amount of 0.001–5 wt % with respect to the mixture comprising the first and the second components.

12. The electronic device according to claim 7 wherein said mixture is applied over said amorphous silicon layer by printing before said mixture is cured.

13. The electronic device of claim 11 wherein said mixture is applied over said amorphous silicon layer by printing before said mixture is cured.

14. An electronic device including at least one solar cell comprising:
    a substrate;
    as first electrode formed on said substrate;
    a photoelectric conversion layer comprising amorphous silicon on said first electrode;
    a second transparent electrode formed on said photoelectric conversion layer;
    a transparent protective film formed over said second transparent electrode, wherein said transparent protective film is formed by applying a resin mixture and curing with heat, said mixture comprising:
        a first component comprising a polyfunctional blocked isocyanate compound, wherein a dicarbonyl compound is used as a block agent, which dissociates an isocyanate group upon heating; and a second component comprising a polyol comprising polymers or oligomers having reactive hydroxyl groups which react with isocyanate groups to form urethane bonds.

15. The electronic device of claim 14 wherein said dicarbonyl compound is a diethyl malonate or an ethyl acetoacetate.

16. The electronic device of claim 14 wherein the second component comprises a resin having a number-average molecular weight of 1,200 to 50,000, said resin selected from the group consisting of a phenoxy resin, bisphenol epoxy resin and a mixture thereof.

17. The electronic device of claim 14 wherein the second component comprises a phenoxy resin or a bisphenol epoxy resin having a number-average molecular weight of 2,500 to 20,000.

18. The electronic device of claim 14 wherein said mixture is added with a material selected from the group consisting of a silicone-based polymer, an acrylic-based polymer and a mixture thereof at a quantity of from 0.001 to 5% by weight with respect to the mixture comprising the first and second components.

19. The electronic device of claim 14 wherein said mixture is added with particles of at least one selected from the group consisting of $SiO_2$, $Al_2O_3$, $TiO_2$, $CaCO_3$, and carbon black as pigment particles.

20. The electronic device of claim 14 wherein said mixture is applied over a part of said second transparent electrode by printing before said mixture is cured.

21. An electronic device including at least one solar cell comprising:
   a first electrode formed over a substrate;
   an amorphous silicon layer having a photovoltaic effect formed on the first electrode;
   a first interlayer insulating film formed on a portion of said amorphous silicon layer;
   a transparent electrode formed on said amorphous silicon layer and said interlayer insulating film; and
   a second interlayer insulating film formed on said transparent electrode,
   wherein each of said first and second interlayer insulating films is formed by applying a resin mixture and curing with heat, said mixture comprising:
      a first component comprising a polyfunctional blocked isocyanate compound, wherein a dicarbonyl compound is used as a block agent, which dissociates an isocyanate group upon heating; and
      a second component comprising a polyol comprising polymers or oligomers having reactive hydroxyl groups which react with isocyanate groups to form urethane bonds.

22. The electronic device of claim 21 wherein said dicarbonyl compound is a diethyl malonate or an ethyl acetoacetate.

23. The electronic device of claim 21 wherein the second component comprises a phenoxy resin or a bisphenol epoxy resin having a number-average molecular weight of 1,200 to 50,000.

24. The electronic device of claim 21 wherein the second component comprises a phenoxy resin or a bisphenol epoxy resin having a number-average molecular weight of 2,500 to 20,000.

25. The electronic device of claim 21 wherein said mixture is added with a material selected from the group consisting of a silicone-based polymer, an acrylic-based polymer and a mixture thereof at a quantity of from 0.001 to 5% by weight with respect to the mixture comprising the first and the second components.

26. The electronic device of claim 21 wherein said mixture contains particles of at least one selected from the group consisting of $SiO_2$, $Al_2O_3$, $TiO_2$, $CaCO_3$, and carbon black as pigment particles.

27. The electronic device of claim 21 wherein said mixture of the first interlayer insulating film is applied over said first electrode by printing before said mixture is cured.

* * * * *